(12) United States Patent
Lindner et al.

(10) Patent No.: US 10,239,253 B2
(45) Date of Patent: Mar. 26, 2019

(54) METHOD FOR EMBOSSING OF SUBSTRATES

(71) Applicant: EV Group E. Thallner GmbH, St. Florian (AT)

(72) Inventors: Friedrich Paul Lindner, Scharding (AT); Thomas Glinsner, St. Florian am Inn (AT); Markus Wimplinger, Ried im Innkreis (AT)

(73) Assignee: EV Group E. Thallner GmbH, St. Florian (AT)

( * ) Notice: Subject to any disclaimer, the term of this patent is extended or adjusted under 35 U.S.C. 154(b) by 594 days.

(21) Appl. No.: 14/717,003

(22) Filed: May 20, 2015

(65) Prior Publication Data

US 2015/0251349 A1    Sep. 10, 2015

Related U.S. Application Data

(62) Division of application No. 12/858,509, filed on Aug. 18, 2010, now Pat. No. 9,116,424.

(30) Foreign Application Priority Data

Aug. 22, 2009    (EP) ..................................... 09010779

(51) Int. Cl.
*B29C 59/02* (2006.01)
*B82Y 10/00* (2011.01)
(Continued)

(52) U.S. Cl.
CPC .......... *B29C 59/026* (2013.01); *B29C 59/022* (2013.01); *B29C 71/04* (2013.01);
(Continued)

(58) Field of Classification Search
None
See application file for complete search history.

(56) References Cited

U.S. PATENT DOCUMENTS

| 5,746,122 A | 5/1998 | Gietz et al. ..................... 100/43 |
| 2005/0064054 A1 | 3/2005 | Kasumi .......................... 425/112 |

(Continued)

FOREIGN PATENT DOCUMENTS

| JP | 2005-101201 A | 4/2005 | .......... H01L 21/027 |
| JP | 2005-286062 A | 10/2005 | .......... H01L 21/027 |

(Continued)

OTHER PUBLICATIONS

Machine Translation of Hosoda et al. (WO 2007/094213) (no date available).*

*Primary Examiner* — James Mellott
(74) *Attorney, Agent, or Firm* — Kusner & Jaffe

(57) ABSTRACT

A method for embossing a structure material on a substrate disposed within a device having side walls, a base plate and a cover that define a working space that is isolated from a surrounding environment. The method includes the steps of: a) moving the substrate using a first calibration means and aligning the substrate with an application means, b) applying the structure material to the substrate, c) moving the substrate using a second calibration means that is located at least partially in the working space wherein the substrate is disposed within the working space and is aligned with an embossing means that is located at least partially in the working space, and d) embossing the structure material on the substrate while the substrate is in the working space using the embossing means, wherein the working space has a defined atmosphere, before and during the step of embossing, without interruption.

13 Claims, 2 Drawing Sheets

(51) Int. Cl.
*B82Y 40/00* (2011.01)
*G03F 7/00* (2006.01)
*B29C 71/04* (2006.01)
*B29K 105/24* (2006.01)

(52) U.S. Cl.
CPC ............... *B82Y 10/00* (2013.01); *B82Y 40/00* (2013.01); *G03F 7/0002* (2013.01); *B29C 2059/023* (2013.01); *B29K 2105/24* (2013.01)

(56) References Cited

U.S. PATENT DOCUMENTS

| | | | |
|---|---|---|---|
| 2005/0150451 A1* | 7/2005 | Tanaka | H01L 21/6715 118/688 |
| 2005/0212156 A1 | 9/2005 | Tokita et al. | 264/1.36 |
| 2005/0275125 A1 | 12/2005 | Kawakami et al. | 264/40.5 |
| 2006/0175736 A1* | 8/2006 | Xu | B41M 7/0072 264/338 |
| 2007/0063384 A1 | 3/2007 | Choi et al. | 264/319 |
| 2007/0065532 A1 | 3/2007 | Choi et al. | 425/375 |
| 2007/0077325 A1 | 4/2007 | Yu | 425/385 |
| 2008/0012151 A1* | 1/2008 | Kemppainen | H01L 51/0021 257/786 |
| 2009/0026658 A1 | 1/2009 | Hosoda et al. | 264/319 |
| 2009/0108484 A1* | 4/2009 | Kruijt-Stegeman | B82Y 10/00 264/40.5 |
| 2009/0267268 A1 | 11/2009 | Yoneda et al. | 264/319 |
| 2011/0284499 A1 | 11/2011 | Suehira et al. | 216/41 |

FOREIGN PATENT DOCUMENTS

| | | | | |
|---|---|---|---|---|
| JP | 2007-283674 A | 11/2007 | ............ | B29C 59/02 |
| JP | 2008-168641 A | 7/2008 | ............ | B29C 59/02 |
| JP | 2009-088376 A | 4/2009 | ............ | H01L 21/027 |
| WO | WO 2007/067469 | 6/2007 | ............ | G03B 27/58 |
| WO | WO 2007/094213 A1 | 8/2007 | ............ | B29C 59/02 |
| WO | WO 2007094213 A1 * | 8/2007 | ............ | B29C 59/022 |
| WO | WO 2007/123805 | 11/2007 | ............ | B29C 47/76 |

* cited by examiner

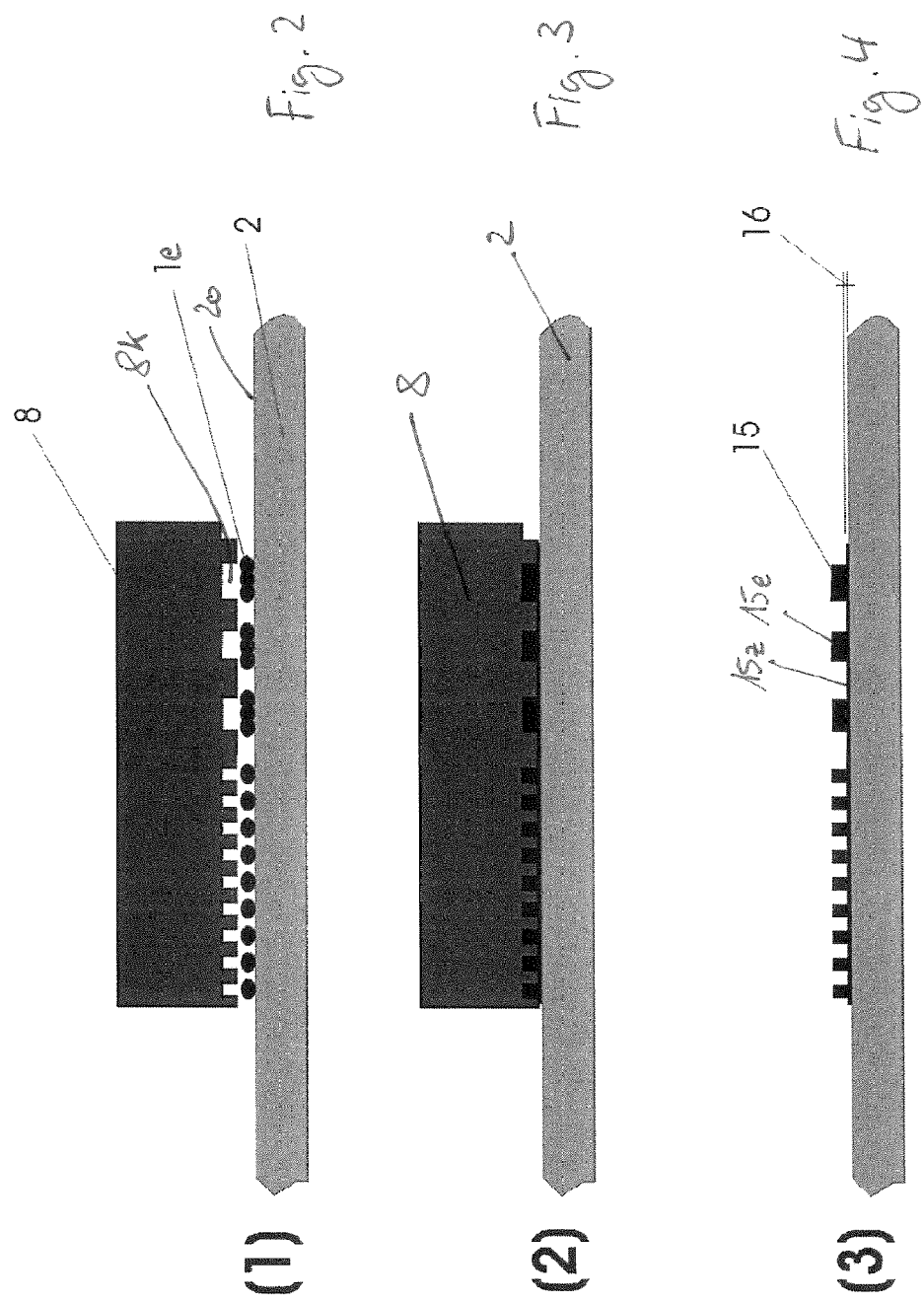

METHOD FOR EMBOSSING OF SUBSTRATES

RELATED APPLICATIONS

This application is a divisional of U.S. application Ser. No. 12/858,509, filed Aug. 18, 2010, which claims priority from European Patent Application No. 09010779.8, filed Aug. 22, 2009, said patent applications hereby fully incorporated herein by reference.

FIELD OF THE INVENTION

This invention relates to a device and a method as claimed in the claims.

BACKGROUND OF THE INVENTION

Embossing methods such as for example hot embossing of polymer substrates, spin-on oligomers or polymers or UV-based nanoimprint methods are known as "single step" or "step & repeat" methods, the step-and-repeat methods being suitable for producing large substrates, for example 300 mm silicon wafers which are embossed in many individual steps. For example, small, more economical, structured quartz glass dies with active areas of for example 25 mm×25 mm with very high resolutions <10 nm and calibration accuracies <50 nm between the die and substrate are achieved.

Known embossing methods for producing structure sizes in the nm and micron range often have the problem of gas inclusions in the photoresist which on the one hand can originate from closed ambient air between the die and substrate, on the other hand can also be formed by the solvent escaping from the resist.

Therefore the object of the invention is to devise a method and a device with which structures as free of faults as possible can be applied to the substrates, even for very high resolutions in the nanometer range.

This object is achieved with the features of the claims. Advantageous developments of the invention are given in the dependent claims. All combinations of at least two of the features given in the specification, the claims and/or the drawings also lie within the framework of the invention.

SUMMARY OF THE INVENTION

The invention is based on the idea of setting a defined atmosphere in the decisive step of embossing the structure into the structure material located on the substrate, the defined atmosphere differing from the atmosphere surrounding the device, especially with respect to gas pressure. In this respect there are means for setting such a defined atmosphere within the device.

Furthermore, the defined atmosphere can comprise a certain pressure which differs especially from the vicinity, preferably by means for setting and/or adjusting the pressure. Preferably contact-making takes place at a given pressure $p_1$, while filling of the die take place at a given pressure $p_2$. Here $p_1$ is advantageously smaller than $p_2$.

For example, the means can be suitable for at least mostly removing or eliminating certain fluids and/or impurities from a working space which at least partially holds the embossing means or enriching them in a region of the working space separated from the embossing means.

Inclusions of foreign material in the structure material are significantly reduced or completely precluded by the aforementioned measures.

In one advantageous configuration of the device as claimed in the invention, the defined atmosphere is defined by a gas pressure less than the gas pressure outside of the working space. Even more advantageously the defined atmosphere is essentially free of gases or is provided with a very low gas concentration compared to the atmosphere surrounding the working space, even more preferably there being no ambient air in the working space. This can be achieved for example in the form of a vacuum with a pressure <300 mbar, prior flushing of the ambient air out of the working space with other gases also lying within the framework of the invention. The defined atmosphere especially preferably has an O2 content <3%, especially <1%, even more preferably <0.5%. Ideally an O2-free atmosphere prevails in the working space.

It is furthermore advantageous if the working space can be exposed to a vacuum as the defined atmosphere by a vacuum means by way of a vacuum line which connects the working space to the vacuum means.

If the device is made as a step & repeat device for embossing the substrate in several embossing steps within the embossing process, very large substrates can be used when small, economical embossing dies are used. The embossing dies have embossing structures to be embossed onto the substrate, for miniaturization of the structures the corresponding embossing structures being made as nanostructures or smaller than nanostructures. This results in that the components and other means, especially a calibration means, which are contained in the device, must work exactly according to the provided nanostructures. In this connection the defined atmosphere benefits the indicated means.

By the device having an application means located at least partially in the working space for application of structure material to the substrate in an application process, the aforementioned advantages and configurations can also be transferred to the application process.

Thus it is for example advantageous if the application process is divided into several application steps for application of the structure material to surface sections of the substrate.

Furthermore, in one advantageous configuration of the invention it is provided that the application means has nozzles for application of the structure material in droplet form. Alternatively the application means can have means for application of the structure material in a spin method or screen printing method or spray method or piezo method.

By the application process being able to be carried out at least partially in the above described defined atmosphere, possible gas inclusions which arise when the structure material is applied or gas inclusions which arise by vaporization of solvents present in the structure material can be largely avoided or completely precluded.

A configuration of the invention is especially advantageous in which the application process can be controlled such that structure material is applied only in structure regions which correspond to the cavities of the embossing die in defined structure material units. On the one hand, this measure can save considerable amounts of structure material and on the other hand the resulting total thickness of the structures applied to the substrate can be minimized. In this way, the processing time, especially in the curing process and etching process which follow the embossing process is moreover minimized. In addition, this measure leads to a uniform residual layer thickness. In this case it is especially advantageous to emboss in a vacuum in order to minimize the danger of gas inclusions especially in this version.

It is especially advantageous here if the structure material units have a slightly larger volume, especially one which is larger by up to 10%, preferably up to 5%, than the corresponding cavities of the embossing die, since when the structure material units are displaced by the cavities in the embossing process excess structure material accordingly forms a connection between the adjacent raised structures as a closed intermediate layer between the raised structures.

The method as claimed in the invention for embossing of the substrates, especially semiconductor substrates or wafers, in the most general embodiment has the following steps:
a) Calibration of the substrate by a calibration means relative to an application means for applying structure material to the substrate in an application process,
b) application of the structure material or structure material units of the structure material to the substrate by the application means,
c) calibration of the substrate by a calibration means which is located at least partially in the working space relative to an embossing means which is located at least partially in the working space for embossing the structure material onto the substrate in an embossing process and
d) embossing of the substrate by the embossing means, and the working space before and during the embossing process can be supplied with a defined atmosphere especially without interruption.

The calibration process according to step a) can be carried out in the working space, especially with the calibration means according to step c), but also as a separate step outside the working space, in this case step b) also being carried out outside the working space. This can be advantageous especially when using the spin method in the application of the structure material. Here is it also advantageous if the application of the structure material which takes place outside the working space takes place in a defined atmosphere, analogously to the above described defined atmosphere, especially with variable pressure.

To the extent calibration according to step a) and application according to step b) are carried out in the working space, the structure material is advantageously applied to the substrate located underneath from the upper section of the working space.

The embossing means is also advantageously located in the upper section of the working space and the embossing die in one advantageous configuration of the invention is arranged with a capacity to move parallel to an application element of the application means.

Movement of the embossing die and/or the application element is advantageously effected from outside the working space.

Other advantages and feasible versions of the invention are reproduced in the other claims, the figures, the specification and the drawings.

BRIEF DESCRIPTION OF THE DRAWINGS

FIG. 2 shows a schematic view of the substrate and structure material and of the embossing die as claimed in the invention shortly before embossing, FIG. 3 shows a schematic view of the substrate and the structure material and of the embossing die as claimed in the invention during embossing and FIG. 4 shows a substrate which has been embossed as claimed in the invention after one embossing step and after the curing process.

DETAILED DESCRIPTION OF PREFERRED EMBODIMENT

Figure 1:
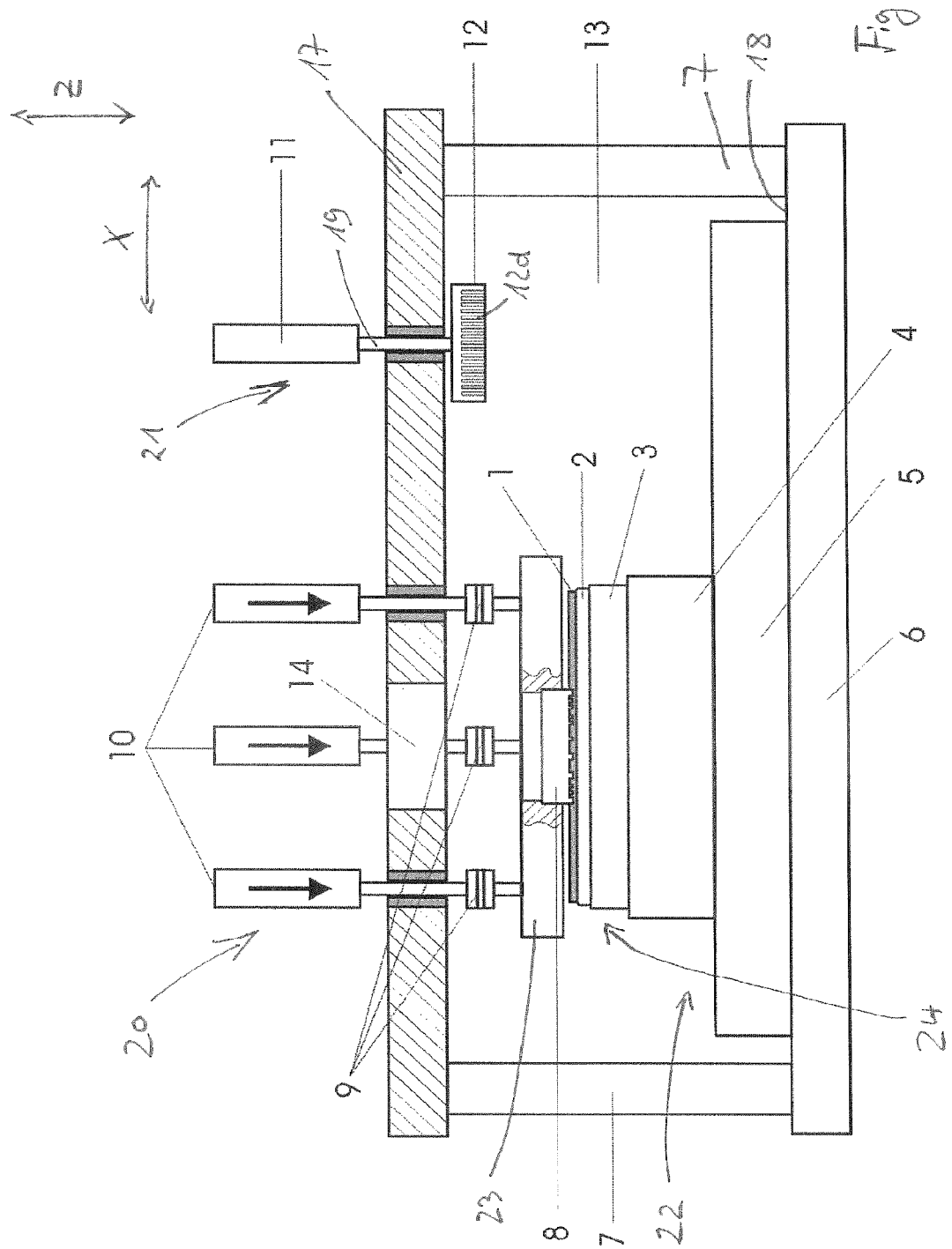
FIG. 1 shows a schematic side view of one embodiment of the device as claimed in the invention.

In the figures the same components or components with the same function are identified with identical reference numbers.

FIG. 1 shows the device as claimed in the invention in one embodiment with a working space 13 which is bordered by side walls 7, a cover 17 and a base plate 6.

On the base plate 6 there is a calibration plate 5 which extends essentially over the entire bottom 18 of the working space 13.

On the calibration base plate 5 there is a calibration table 4 with a capacity to move, especially guided in the X direction, in order to move a substrate holder 3 which is located on the calibration table 4, especially fixed, within the working space 13, especially to an embossing means 20 and an application means 21. The substrate holder 3 is a component of a receiving means 24.

The calibration base plate 5 and the calibration table 4 are a component of a calibration means 22 which is responsible for the above described sequence of movements. Furthermore the calibration means 22, especially the calibration table 4, is designed for exactly calibrating and aligning the substrate holder 3 with a substrate 2 located on it relative to the application means 21, specifically in the X direction shown in FIG. 1 and the Y direction pointed into the plane of the drawing from FIG. 1 and in the rotation direction in the plane E spanned by the X and Y direction. Here the positioning and calibration process is controlled by a control means which is not shown, and exact alignment can take place using gauge marks which are not shown on the substrate 2 and/or the substrate holder 3.

Positioning and calibration of nozzles 12d of a nozzle body 12 of the application means 21 in the Z direction take place by an application actuator 11 on which the actuator rod 19 of the nozzle bodies which penetrates the cover 17 is attached transversely, therefore parallel to the plane E.

Structure material 1 is applied to the top 2o of the substrate 2 opposite the nozzle body 12 by the nozzles 12d. Application takes place in a step-and-repeat process, i.e. the top 2o is supplied with structure material 1 in several steps. In doing so defined structure material units 1e of the structure material 1 (see FIG. 2) are applied to the top 2o of the substrate 2 and placed such that they correspond to cavities 8k of an embossing die 8 in the later embossing process, therefore are applied exclusively in structure regions which are later cured as raised structures 15e. In this respect it is advantageous if the individual application steps of the application means 21 correspond to the individual embossing steps of the embossing means 20. The nozzles 12d therefore especially precisely cover a region of the substrate 2 which corresponds to the embossing surface of the embossing die 8 or a multiple of this region.

As soon as the top 2o of the substrate 2 has been completely supplied with structure material 1 or with structure material units 1e, the substrate 2 is positioned opposite the embossing means 20 and calibrated relative to the embossing die 8 in order to carry out the embossing process shown in FIGS. 2 and 3.

This is likewise done in a step-and-repeat process and the embossing force of the embossing die 8 is applied to the structure material 1 and the substrate 2 by way of a die holding device 23 which holds the embossing die 8 and actuators 10 which act on the embossing die 23.

Dynamometer cells 9 connected to the control means measure the force applied by the actuators 10 and/or the position, and all three actuators 10 can be used individually in a position-controlled and/or force-controlled manner, so that edge regions can also be homogeneously embossed by shifting the embossing force into the center of the contact surface.

In the position of the embossing die 8 shown in FIG. 3 to the substrate 2, the curing process is carried out especially by UV exposure of the structure material 1 which is a photoresist, through a window 14 which is inlet in the cover 17.

After removal of the embossing die 8 by the actuators 10 the cured structure material 15 shown in FIG. 4 remains on the substrate 2, consisting of raised structures 15e and an intermediate layer 15z with an intermediate layer thickness 16. The remaining intermediate layer thickness 16 is removed by the etching process after complete embossing and curing of the entire substrate 2 in order to structure the substrate 2. The raised structures 15e are used as the etching mask.

For the substrate 2, the substrate to be structured can be round or rectangular substrates, for example semiconductor wafers, glass wafers, a ceramic substrate or a polymer substrate.

The substrate holder 3 can be made for example as an adhesion holding device or electrostatic holding device.

The embossing die 8 can be made as a rectangular or round die for stamping or embossing the structures, for example by hot embossing or UV embossing or micro contact printing.

But it can also consist at least partially of quartz, glass and/or hybrid structures and can be formed from a carrier, a compensation layer and a structure layer or a carrier and an elastic structure layer.

The structure material 1 is cured depending on the structure material, for resist for example by UV light or IR light.

The nozzles 12d are configured such that the structure material units 1e applied as droplets are exactly dimensioned by the volume in order to correspond to the volume of the cavities 8k of the embossing die 8, the droplet density and the droplet volume being dimensioned according to the volume of the cavities 8k which is to be filled such that an intermediate layer thickness 16 as small as possible remains. The droplet volume can advantageously be set to be constant and for larger cavities 8k several droplets per cavity 8k are then applied. The constant droplet volume of the substrate material units 1e can correspond to the smallest cavity 8k, while for larger cavities 8k a plurality of substrate material units 1e is applied.

The cured structure material 15 can act directly as a functional layer, but also, as described above, as an etching mask for structure transfer into the substrate.

Having described the invention, the following is claimed:

1. A method for applying a structure material to a substrate and embossing the structure material on the substrate, the applying and embossing being performed in an embossing device, the embossing device having side walls, a base plate, and a cover that define a working space that is isolated from a surrounding environment, the method comprising:
    first calibrating and aligning the substrate with an application means of the embossing device, the first calibrating and aligning being performed within the embossing device by a calibrating means of the embossing device, the calibrating means being located at least partially in the working space of the embossing device,
    performing one or more applications of the structure material to the first calibrated and aligned substrate while the first calibrated and aligned substrate is in the working space, the applications being performed using the application means,
    second calibrating and aligning the first calibrated and aligned substrate with an embossing means of the embossing device, the embossing means being located at least partially in the working space of the embossing device, the second calibrating and aligning being performed within the embossing device by the calibrating means of the embossing device, the embossing means comprising an embossing die, one or more actuators that are individually position-controlled and/or force controlled, and one or more dynamometer cells respectively corresponding with the actuators, the dynamometer cells being configured to measure an embossing force applied by the actuators and/or respective positions of the actuators, and
    performing one or more embossings of the structure material on the second calibrated and aligned substrate while the second calibrated and aligned substrate is in the working space, the performing the embossings comprising:
        respectively operating the actuators to move the embossing die and apply the embossing force to the structure material and the second calibrated and aligned substrate via the embossing die;
        respectively operating the dynamometer cells to measure the embossing force applied to the structure material by the actuators acting on the embossing die and/or the respective positions of the actuators,
    wherein the working space has a defined atmosphere, before and during performing of the one or more embossings, without interruption,
    wherein the application means includes at least one nozzle disposed in the working space and an actuator for moving the at least one nozzle in a direction perpendicular to the substrate, and
    wherein an actuator rod of the actuator extends through the cover of the device.

2. A method as claimed in claim 1, wherein the defined atmosphere is different than the surrounding environment that is isolated from the isolated working space.

3. A method as claimed in claim 1, wherein the defined atmosphere has a gas pressure that is less than a gas pressure in the surrounding environment that is isolated from the working space.

4. A method as claimed in claim 1, wherein the defined atmosphere is free of gases.

5. A method as claimed in claim 1, wherein the defined atmosphere is a vacuum.

6. A method as claimed in claim 1, wherein the performing the one or more applications of the structure material includes at least one of the following: pneumatic or thermal methods, a piezo method, a screen printing method, a spray method or a spin method.

7. A method as claimed in claim 1, wherein the embossing means comprises an embossing die, and
    wherein the performing of the one or more applications of the structure material comprises applying defined structure material units of the structure material to a top of the substrate at locations that correspond to cavities in the embossing die.

8. A method as claimed in claim 7, wherein the locations at which the defined structure material units are placed have respective volumes that are 10% larger than volumes of the corresponding cavities in the embossing die.

9. A method as claimed in claim 1, wherein after said performing of the one or more embossings, said method further comprising:
curing the structure material,
removing the embossing means from the substrate, and
etching the substrate using the structure material as an etching mask.

10. A method as claimed in claim 1, wherein the first calibrating and aligning takes place within the isolated working space.

11. A method as claimed in claim 10, wherein said first calibrating and aligning and the performing the one or more applications occur in an atmosphere that is different than the defined atmosphere of the working space before and during the performing of the one or more embossings.

12. A method as claimed in claim 10, wherein a pressure in the working space during the first calibrating and aligning and the performing the one or more applications is greater than a pressure in the working space during the performing of the one or more embossings.

13. A method as claimed in claim 1, further comprising:
curing the structure material after said performing of the one or more embossings, the cured structure material being configured to act as a functional layer or an etching mask that is configured to transfer a structure into the substrate.

\* \* \* \* \*